United States Patent [19]

Kitabayashi

[11] Patent Number: 5,063,611
[45] Date of Patent: Nov. 5, 1991

[54] THEFT-PROTECTED VEHICULAR ACCESSORY APPARATUS, PARTICULARLY CAR RADIO AND AUDIO EQUIPMENT

[75] Inventor: Shinichi Kitabayashi, Tokyo, Japan

[73] Assignee: Blaupunkt Werke GmbH, Hildesheim, Fed. Rep. of Germany

[21] Appl. No.: 222,271

[22] Filed: Jul. 21, 1988

[30] Foreign Application Priority Data

Aug. 28, 1987 [DE] Fed. Rep. of Germany ....... 8711687

[51] Int. Cl.$^5$ .............................................. H04B 1/08
[52] U.S. Cl. .................................... 455/348; 455/345; 455/90; 455/352
[58] Field of Search .................... 455/89, 90, 344, 345, 455/348, 349, 347, 351, 352, 151, 346

[56] References Cited

U.S. PATENT DOCUMENTS

| | | | |
|---|---|---|---|
| 3,617,985 | 11/1971 | Kehl | 455/89 |
| 4,124,815 | 11/1978 | Stoschek | 455/89 |
| 4,153,877 | 5/1979 | Fathauer et al. | 455/76 |
| 4,194,157 | 3/1980 | Uno | 455/348 |
| 4,286,335 | 8/1981 | Eichler et al. | 455/89 |
| 4,481,512 | 11/1984 | Tscheulin et al. | 455/349 |
| 4,578,739 | 3/1986 | McKee et al. | 361/395 |

Primary Examiner—Douglas W. Olms
Assistant Examiner—Ralph Smith
Attorney, Agent, or Firm—Frishauf, Holtz, Goodman & Woodward

[57] ABSTRACT

To prevent theft of a car radio (R), the radio unit itself is located in the vehicle (V) in a suitable secure location. The radio is controlled by a two-part control unit, in which one part of the control unit forms a connection part (1), secured to the vehicle, for example, by a gooseneck (5) or the like, and the other part forming a control part (21) which is separable from the connection part. Interengaging dovetail track-and-groove connections permit ready removal of the control part (21) from the connection part, so that a user may remove the control part, and thus not leave any indication in the vehicle that it contains a car radio. The control part contains the necessary control buttons and display functions to operate and control the car radio, the connection part merely including a plurality of contact terminals which, with the control part removed, are depressed below a top surface of a housing (2, 3) of the connection part.

15 Claims, 2 Drawing Sheets

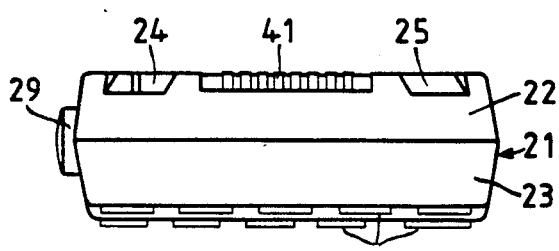
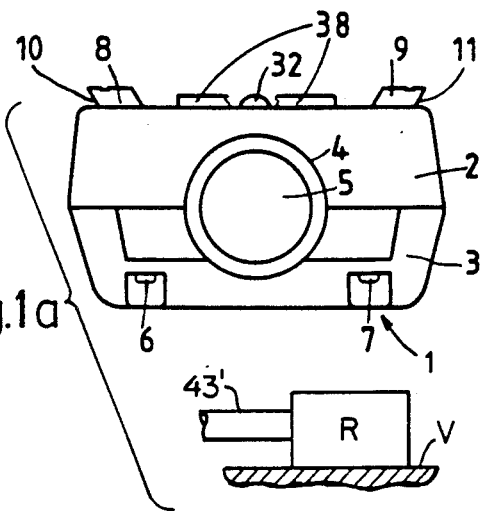
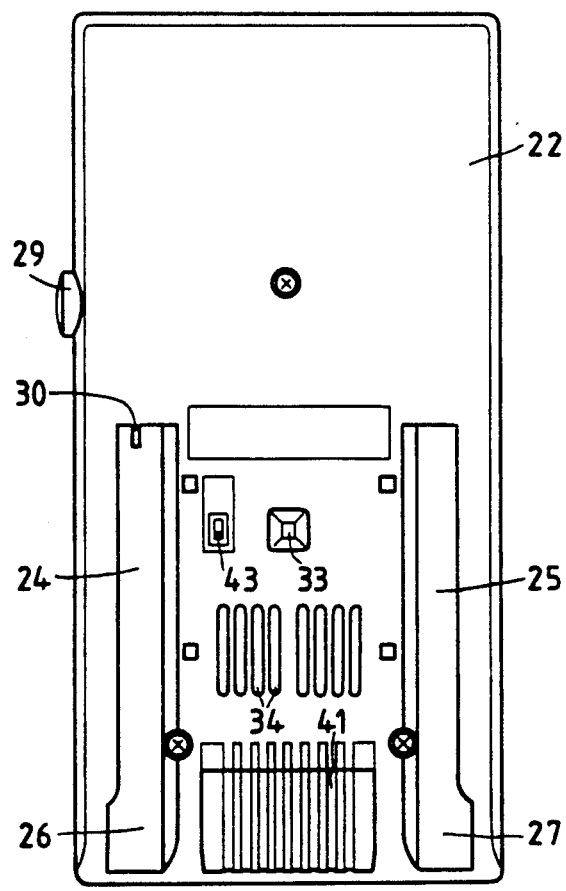
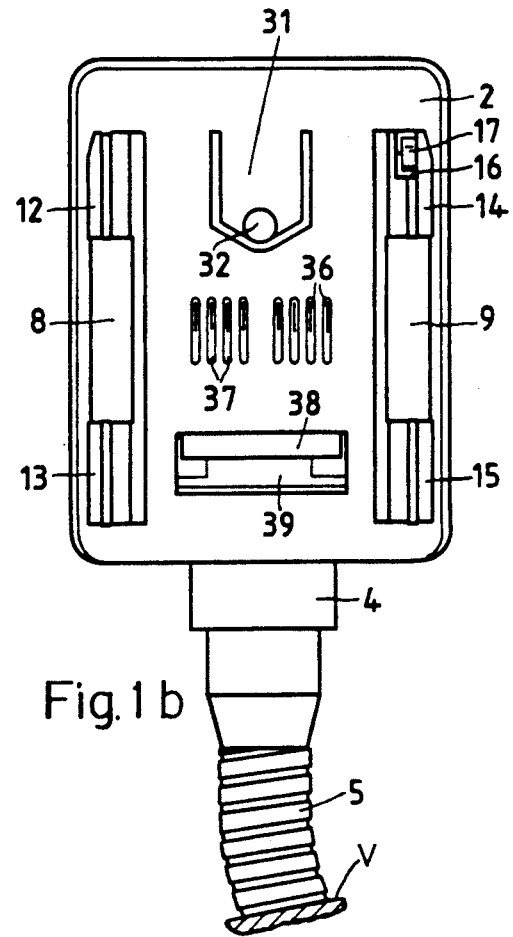
Fig. 2a
Fig. 1a
Fig. 2b
Fig. 1b

THEFT-PROTECTED VEHICULAR ACCESSORY APPARATUS, PARTICULARLY CAR RADIO AND AUDIO EQUIPMENT

The present invention relates to theft-protected accessory apparatus for vehicles, and more particularly to protecting car radios and car audio equipment against theft by so arranging the equipment that a portion thereof is readily severable and can be removed from the vehicle, to be taken along by the user of the equipment upon leaving the vehicle unattended.

DEFINITION

In the discussion and specification that follows, reference will be made generally to "car radios", although it is to be understood that equivalent audio apparatus is to be likewise included and, further, that this generic designation can also be applied to other accessory apparatus which is subject to theft, such as citizen band (CB) radio other types of communication equipment, and other removable accessories.

BACKGROUND

Car radios, usually, are installed in a recess behind an opening cut into the dashboard of cars. The visible surface of the car radio, which then matches the remainder of the dashboard, is used to receive the control elements and display elements, such as control knobs, display panels, dials, and indicators. The selection of the location of installation for the car radios is usually based on convenience for the user of the equipment, that is, to so locate the car radio that the operator of the vehicle can readily control the car radio. This, usually, requires placing the car radio in the vicinity of the steering wheel. A suitable and desirable location for the operating elements can readily be obtained by associating the operating elements and the indicators in a separate operating or control unit component. This separate or control unit component can then be secured to the vehicle at a desired location by a movable position-retaining gooseneck or flexible conduit. Placing the operating component on a goose-neck also permits passengers in the vehicle to control the car radio; the arrangement, thus, permits both the vehicle operator, as well as other passengers in the vehicle, to have ready access to the control component and, especially for the vehicle operator, to place the control component in a convenient position for operation also during operation of the car. The car radio itself then does not require any more operating elements and displays and can be located at any desirable location with the vehicle, not visible externally. This increases the safety of the apparatus with respect to theft or vandalism. The goose neck can be secured to the vehicle in an essentially theft-proof manner, that is, in such a manner that removal thereof and of the radio becomes unattractive to the average thief.

Unfortunately, many potential thieves do not know that it is difficult to remove the operating component and then to find the car radio to which it is connected; thus, vandalism and forceful interference with the control component is still a problem.

THE INVENTION

It is an object to improve the security of car radios in vehicles, and more particularly to so arrange a car radio with a separate or remote operating unit that the equipment in the vehicle does not indicate to a potential thief or vandal that the vehicle is equipped with a car radio or similar and potentially removable accessory apparatus.

Briefly, the control unit is located in the vehicle in an exposed position, for example coupled to a goose-neck or the like. In accordance with a feature of the invention, the control unit is a two-part structure which has a connection part mechanically sturdily secured to the vehicle, for example via the goose-neck, and electrically coupled to the accessory apparatus. A control part is selectively separably coupled to the connection part, for example by interengaging attachment means such as a dovetail slide connection. The control part itself carries the control buttons or knobs, and the display. It can be constructed in a small, light-weight manner, and removed from the connection part when the user of the vehicle leaves the vehicle. The control part can be made small enough so that it can readily fit into a coat or jacket pocket, and can be assembled with the connection part only when the user wishes to use the car radio. The connection part, when the control part is removed, then will no longer have the appearance of an element used to control a car radio. The car radio itself can be located in the vehicle at any desirable place, out of sight, and sturdily secured to the vehicle so that theft thereof becomes difficult. Since the connection part does not give away its function—as an element of a car radio—a potential thief looking through the window of the vehicle will be unaware that the vehicle is equipped with a car radio. The radio without its specific control is useless.

In accordance with a feature of the invention, the control part and the connection part are so interengaged that the control part can be easily removed and, conversely, easily reassembled with the connection part. Reliable electrical connection between the two parts is ensured by spring-loaded components.

In accordance with a preferred feature of the invention, the two parts have electrical components which are so arranged thereon that they are protected against damage or dirt or other contamination when removed while, further, ensuring reliable connection when they are assembled. In accordance with a preferred feature of the invention, the two parts have their contacts located in recesses protected by surrounding ridges or ribs, with spring-loaded contacts which are unlatched when the two parts are engaged, but which can remain depressed within the recesses when disengaged.

In accordance with another preferred feature of the invention, the control part is located within a housing which is so shaped that it does not have any sharp edges or projections which, for example when placed in a pocket of a user, or in a pocketbook, might cause damage to the pocket or the pocketbook while, additionally, preventing damage to the exposed connection terminals, or deposit of dirt or other contaminants interfering with good electrical contacts.

In accordance with a preferred feature of the invention, the connection part is secured to a goose-neck which, in turn, is securely attached to the vehicle, retaining within a hollow portion of the goose-neck the necessary cables and connection lines to control the car radio itself which can be located in any convenient and theft-resistant position on the vehicle. Other locations for the connection part may be used, however, for example the connection part may be placed on the dashboard, or at the center of the steering wheel for example. Since the control part can readily removed from the connection part, the presence of the connection part in the vehicle, with the control part removed, will not indicate to a potential thief that the vehicle is equipped with a car radio.

DRAWINGS, illustrating an illustrative embodiment:

FIG. 1a is an end view of the connection part, designed for attachment to a goose-neck;

FIG. 1b is a top view of the connection part, with the control part removed;

FIG. 2a is a side view of the control part;

FIG. 2b is a bottom view of the control part, removed from the connection part;

DETAILED DESCRIPTION

Figure 3A:
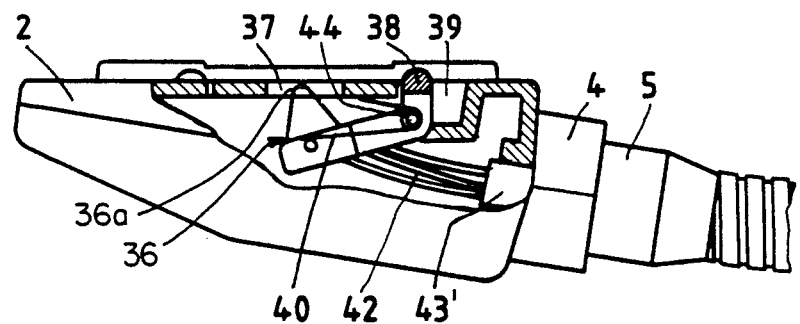
FIG. 3a is a side view of the connection part, partly broken away and in section, illustrating a terminal arrangement.

FIG. 1a illustrates, schematically, a car radio R, securely attached to a vehicle V, shown only as a solid attachment, for example part of the chassis of the vehicle. The location of the car radio R in the vehicle V is selected by the manufacturer of the vehicle and the installer of the radio, respectively, and can be placed so that it is out-of-sight and in a secure location in the vehicle. The radio apparatus R is coupled to the control unit via cabling 43', as will appear.

The control itself includes two interengageable, separable parts. The connection part 1 (FIGS. 1a, 1b) includes a housing formed of two shells 2, 3, secured together by screws 6, 7. The control part 21 (FIGS. 2a, 2b) can be attached to the connection part 1 by an interengaging arrangement, as will appear. The housing portion 2 of the connection part 1 has a coupling 4 thereon for coupling to a goose-neck 5. Goose-neck 5 is secured to the vehicle V at any suitable location, for example to the dashboard, adjacent a transmission shift control, or the like. The housing part 1 is formed with two projecting rails 8, 9, unitary with the housing part 2. The rails 8, 9 are laterally undercut, as shown at 10, 11, to form a projecting dovetail guide arrangement for matching depressions 24, 25 (FIG. 2a) formed in the control part 21. To permit easy attachment and reliable sliding of the rails 8, 9 in the undercut grooves 24, 25 of the control part 21, the rails 8, 9 are slightly raised at the end regions 12, 13, 14, 15. The end region 14 of the rail g is cut out as shown at 16 (FIG. 1b), through which cut-out an operating element 17 of a switch, not further shown, can project. The switch is used to turn OFF the car radio R independently of the switching state of the control part 21 when the control part 21 is removed from the connection part 1.

The rails or tracks 8, 9 are slightly beveled at the end portions 12, 14 in order to facilitate placement of the control part 21 thereon and to ensure proper guidance thereof.

The control part 21, see FIGS. 2a, 2b, includes a housing which, also, is formed in two parts 22, 23. The housing part 22 has two grooves 24, 25 formed therein which, in cross section, match the shape of the rails or tracks 8, 9 of the connection part 1 (FIGS. 1a, 1b) and, together with the rails 8, 9, form an interengaging dovetail projection-and-recess connection. The grooves 24, 25 are open towards the bottom, so that the control part 21—shown upside-down in FIG. 2a—can be slid from the top onto the rails 8, 9 of the connection part 1. The grooves 24, 25 are slightly enlarged at their terminal ends, see FIG. 2b, to additionally facilitate engagement of the control part 21 with the connection part 1.

The housing portion 23 carries the customary control buttons and/or control knobs, and a display, not further shown. The arrangement of the buttons and control knobs is conventional, and in accordance with the design of the car radio. In addition to the conventional control knobs or buttons, a further button 29 is provided on the side of the control part 21, and suitable as a master ON-OFF switch for the car radio. The upper end of the groove 24 has a controlled projection 30 or the like formed thereon which is located and dimensioned and shaped to operate the control portion 17 (FIG. 1b) of the master switch of the car radio, to depress the control button 17 of the master switch when the control part 21 reaches the terminal position of engagement with the connection part 1.

The ends of the grooves 24, 25, see FIG. 2b, form abutment surfaces for the rails 8, 9, thereby limiting movement of the control part. A defined fixed position is, additionally, provided by a resilient snap-in indexing arrangement. The indexing arrangement includes a leaf spring 31, unitary with, or secured to the housing portion 2 of the connection part 1. The leaf spring carries an engagement button 32 which can snap into a depression 33 formed in the surface facing the connection part 1 of the control part 21, when engaged (see FIG. 3b).

The electrical connection between the control part 21 and the connection part 1 is formed by contact pairs. Eight such contact pairs 35 (see FIG. 3b) are so located in the control part 21 that they are accessible through openings 34 formed in the housing portion 22 of the control part 21. These contacts 35 are, preferably, formed by conductive tracks located on a printed circuit board (PCB) or the like, and secured in the inside of the housing part 22, as shown in fragmentary representation in FIG. 3b.

The connection part 1 has counter terminals to connect with the conductive strips 35, formed by contact springs 36 which are movably located so that they do not project above the surface of the connection part 1 when the control part 21 is removed therefrom. The contact springs 36 are located on a rocker 38, pivotable about a pivot axis 44. The rocker is a double-arm rocker, the other part of which extends through an opening 39 from the housing portion 2 of the connection part 1. The portion of the rocker 38 which extends above the housing surface is shown in FIG. 1a in broken-away form, in order to render visible the stop button 32. The contact springs 36 are electrically connected to connection lines 42 of cable 43', which is positioned in the hollow of the goose-neck 5.

The housing portion 22 of the control part 21 additionally carries an operating switch 43 (FIG. 2b) which is shown as a slide switch, utilized for example for control of operating features of the car radio which are only rarely changed. For example, the switch 43 can be used to control whether operation of any one of the buttons or knobs 28 should be aurally indicated to the operator by a chirp sound or the like.

OPERATION

Figure 3B:
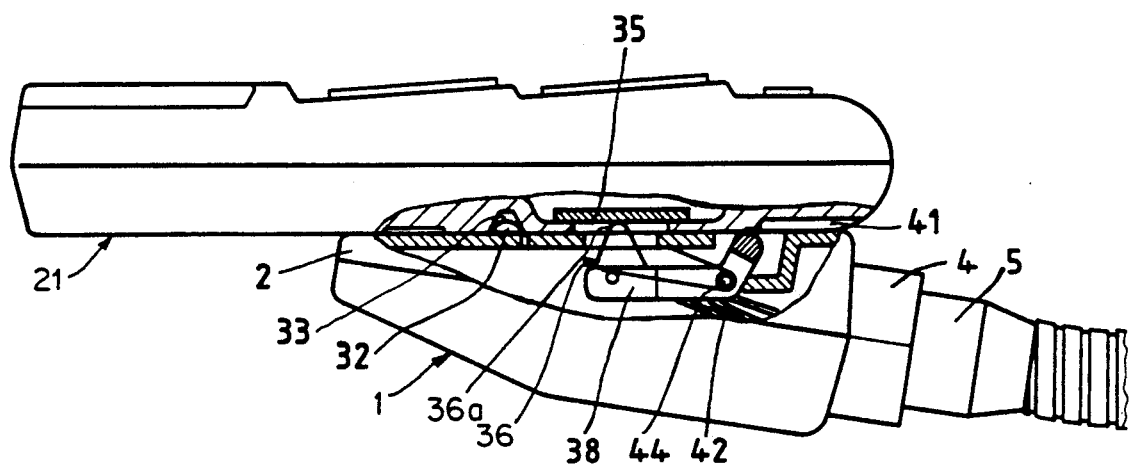
FIG. 3b is a view similar to FIG. 3a, with the control part attached to the connection part and illustrating engagement of the connecting terminals.

Upon interengaging the undercut groove 24, 25 of the control part 21 with the rails or tracks 8, 9 of the connection part 1, the rocker 38 will initially be in the position shown in FIG. 3a. Spring 40 presses the rocker or rockers into the position in which the end portion 38 can be engaged by the housing portion 22 of the control part 21. When the edge 41 of the control part 21 reaches the projecting portion 38 of the rocker 36, the rocker 36 is depressed into the position shown in FIG. 3b. This causes the contact springs 40 and contacting terminal ends 36a to project from beneath the openings 37 and to engage, resiliently and with spring pressure, against the terminal strips 35 of the control unit 21, as seen in FIG. 3b. The contact springs 36 are individually connected to the flexible leads or wires 42 of the cable 43'.

The rocker structure 36 can be a single element of insulating material on which individual contacts 36a are mounted or the contact springs may, individually, carry the respective terminals 36a, and be located adjacent each other, insulated from each other for individual pivoting about pivot 44.

Various changes and modifications may be made within the scope of the inventive concept. The position of the rails and tracks 8 and 9, and the grooves 24, 25 can, of course, be reversed. It is desirable, however, to shape the control part 21 in such a manner that it will not have any unnecessary projecting features and, therefore, the arrangement shown in FIGS. 1a, 1b and 2a, 2b is preferred. The respective housing portions are, as shown in the drawings, as smooth as possible and formed with rounded corners and, respectively, chambered surfaces.

The appearance of the connection part 1, with the control part 21 removed, does not suggest, immediately, the presence of a removable audio equipment in the vehicle since other control functions than those for a car radio can be associated with a suitably designed and arranged control part 21, having nothing to do with potentially removable equipment in the vehicle. The rocker elements or contact springs 36 can be formed, for example, as angularly bent wire elements, having inherent resiliency, so that the terminal portions 36a can be formed as part thereof. Other electrical coupling arrangements between the connection part 1 and the control part 21 can be used.

I claim:
1. The combination of
   a vehicular accessory apparatus, particularly car radio and audio equipment (R) with
   a two-part control unit (1, 21) for said apparatus,
   wherein said accessory apparatus is secured in the vehicle (V) and
   wherein, in order to render said accessory apparatus operable, said control unit (1, 21) must be assembled with said accessory apparatus in said vehicle, and
   wherein said two-part control unit comprises
   an essentially stationary connection part (1) mechanically secured to the vehicle (V) and means (5, 43) for electrically coupling the connection part to said accessory apparatus; and
   a portable control part (21), formed with generally smooth outer surfaces to facilitate transport in an owner's pocket, and which includes a housing (22, 23) having control elements (28, 43) necessary for operation of said accessory apparatus located thereon,
   interengaging attachment means (8, 9; 24, 25) for selectively separably mechanically connecting together said connection and control parts (21); and
   electrical coupling means (35, 36a) positioned, respectively, on said control part (21) and said connection part (1) to permit control of said apparatus (R) when the connection part and the control part are interengaged, while allowing separation of said control part and said connection part and removal of said control part from the connection part, said coupling means including means (38, 40, 41) for automatically extending terminal elements (36a) during interengagement of said control and connection parts and for automatically retracting said terminal elements (36a) into a housing (2, 3) upon disengagement of said control and connection elements.

2. The combination of claim 1, wherein said interengaging attachment means comprise dovetail projection-and-recess means (8, 9; 24, 25)

3. The combination of claim 2, wherein said dovetail projection-and-recess means include a pair of parallel projecting rails or tracks (8, 9) located on one of said control and connection parts and a pair of parallel grooves (24, 25), open at one end, on the other of said parts.

4. The combination of claim 3, wherein the rails or tracks are formed on the connection part (1) and the grooves (24, 25) are formed on the control part (21).

5. The combination of claim 1, further including a resiliently disengageable positive index or indexing and stop locking interengagement arrangement (31, 32, 33) located, respectively, on said connection part and said control part to positively fix the relative position of said two parts when assembled together.

6. The combination of claim 5, wherein said indexing and locking arrangement comprises a depression (33) formed in a surface of the housing (22, 23) of the control part (21) facing a surface of the connection part (1) when said parts are assembled together;
   and a resiliently deflectable engagement button (32) secured to the connection part (1) and located thereon for engagement with said depression (33).

7. The combination of claim 1, further including a switch operating element (17) projecting from the connection part (1);
   and means (30) formed on the control part (21) and engageable with the switch operating element to move the switch operating element upon engagement of said two parts.

8. The combination of claim 1, wherein the connection part (1) includes a housing (2, 3), said housing being formed with openings (37) to permit projection of electrical connection means (36a) forming part of said coupling means therethrough;
   and wherein the electrical connection means in said connection part include contact springs (36, 36a), and means (40, 44) for depressing said contact springs beneath the surface of the housing and within said openings (37) when said control part (21) is disengaged and removed from said connection part (1).

9. The combination of claim 1, wherein said control part (21) includes a housing (22, 23) formed with openings (34) therein;
   and connection terminal elements (35) located within said housing and accessible through said openings (34).

10. The combination of claim 1, wherein the connection part (1) includes a housing (2, 3);
    and wherein the electrical connection means (36, 38) of the connection part are located within said housing and, unless said control part (21) is interengaged by said interengaging attaching means with said connection part (1), said connection means are located beneath a surface defined by said housing.

11. The combination of claim 8, wherein said contact springs comprise a two-arm rocker element or lever, and a spring (40) is provided, so biasing the rocker element or lever that a terminal end (38) projects from a surface of the connection part (1) when said control part (21) is removed therefrom.

12. The combination of claim 11, wherein the contact springs (36, 36a) comprise bent wire spring elements.

13. The combination of claim 8, wherein said control part (21) includes a housing (22, 23) formed with openings (34) therein;

and connection terminal elements (35) located within said housing and accessible through said openings (34), said contact springs engaging through said openings (34) in the housing (22, 23) of the control part (21).

14. The combination of claim 11, further including an operating surface (41) formed on the housing (22, 23) of the control part and positioned and shaped for engagement with a second arm (38) of the two-arm rocker or lever and to depress said second arm and permit projection of a first arm of said rocker or lever from said openings (37) and engagement with the electrical coupling means (35) on said control part (21) upon interengagement of said control part and said connection part.

15. The combination of claim 1, further including a goose-neck flexible conduit (5) coupled to the connection part (1) (1) and secured in the vehicle (V).

* * * * *